United States Patent [19]
Itou

[11] Patent Number: 6,104,641
[45] Date of Patent: Aug. 15, 2000

[54] SWITCHABLE MULTI BIT SEMICONDUCTOR MEMORY DEVICE

[75] Inventor: Takashi Itou, Hyogo, Japan

[73] Assignee: Mitsubishi Denki Kabushiki Kaisha, Tokyo, Japan

[21] Appl. No.: 09/228,980

[22] Filed: Jan. 12, 1999

[30] Foreign Application Priority Data

Jul. 17, 1998 [JP] Japan ................................. 10-203811

[51] Int. Cl.⁷ .................................................. G11C 16/04
[52] U.S. Cl. ...................................... 365/189.01; 365/149
[58] Field of Search ............................. 365/149, 189.04, 365/204, 222, 189.01

[56] References Cited

U.S. PATENT DOCUMENTS 5,841,695  11/1998  Wik ........................................... 365/149
5,970,007  10/1999  Shiratake ................................. 365/207
5,982,657  11/1999  Kong ....................................... 365/149

*Primary Examiner*—David Nelms
*Assistant Examiner*—David Lam
*Attorney, Agent, or Firm*—McDermott, Will & Emery

[57] ABSTRACT

In a switchable multi bit DRAM, in addition to main bit line pair and a main sense amplifier, sub bit line pair and a sub sense amplifier are provided. Between the main bit line pair and the sub bit line pair, transistors are connected, and a transistor, a reference capacitor and a transistor are connected between the main bit line and the complementary sub bit line. By controlling these components, it becomes possible to use the memory cell as a 4-value memory or a binary memory. Therefore, storage capacity and power consumption can be switched.

12 Claims, 15 Drawing Sheets

SWITCHABLE MULTI BIT SEMICONDUCTOR MEMORY DEVICE

BACKGROUND OF THE INVENTION

1. Field of the Invention

The present invention relates to a semiconductor memory device and, more specifically, a dynamic random access memory (DRAM) switchable to a binary (2-value) memory or a multi-value memory.

2. Description of the Background Art

Generally, 1 bit data signal is written to a memory cell by charging a memory cell capacitor to VCC (power supply voltage) or GND (ground voltage). A memory allowing writing of two different values in one memory cell is referred to as a binary memory.

A memory cell allowing writing of three or more different values in one memory cell is referred to as a multi-value memory. A 4-value memory, for example, allows writing of a data signal of 2 bits in a memory cell by charging the memory cell capacitor to VCC, (2/3)·VCC, (1/3)·VCC or to the GND. Therefore, storage capacity of the multi-value memory can be remarkably increased as compared with a binary memory, while control circuitry for writing and reading becomes complicated.

In a notebook type personal computer, for example, it is preferred that the main memory has large storage capacity while an application program is active, whereas it is preferred that the main memory has small power consumption in a suspended state.

The storage capacity, however, is not sufficient, as the binary memory is generally used for the main memory. In the binary memory, capacitor capacitance of the memory cell is made small to increase storage capacity which results in shorter refresh period and greater power consumption.

Though it is possible to use a multi-value memory for the main memory, there is a disadvantage that the multi-value memory has too large a storage capacity in the suspended state, resulting in large power consumption.

SUMMARY OF THE INVENTION

Therefore, an object of the present invention is to provide a semiconductor memory device having large storage capacity.

Another object of the present invention is to provide a semiconductor memory device having small power consumption.

According to the present invention, the semiconductor memory device includes a plurality of dynamic memory cells and a write/read circuit. Each of the dynamic memory cells includes a memory capacitor. The write/read circuit writes a data signal to the dynamic memory cell by charging the memory capacitor to one of a first number of voltages, and reads the data signal from the dynamic memory cell, in a first mode. The write/read circuit writes a data signal to the dynamic memory cell by charging the memory capacitor to one of a second number of voltages larger than the first number of voltages, and reads the data signal from the dynamic memory cell, in a second mode.

In the semiconductor memory device, the storage capacity in the second mode is larger than the storage capacity in the first mode. This allows switching of the memory capacity.

Preferably, the semiconductor memory device further includes a refresh circuit. The refresh circuit refreshes the dynamic memory cell in a first period in the first mode, and refreshes the dynamic memory cell in a second period shorter than the first period in the second mode.

Therefore, in the first mode in which the storage capacity is small, the refresh period is made longer. Here, the capacitor capacitance is sufficiently large for the first mode, and therefore the dynamic memory cell can surely be refreshed. Further, as the refresh period is long in the first mode, power consumption can be reduced.

Preferably, the semiconductor memory device is a synchronous semiconductor memory device operating in synchronization with a clock signal. The semiconductor memory device further includes a mode register. The mode register stores a selecting signal indicating the first and second modes.

Therefore, when the selecting signal indicating the first mode is registered in the mode register, the synchronous semiconductor memory device enters the first mode, and when the selecting signal indicating the second mode is registered, the synchronous semiconductor memory device enters the second mode. Therefore, the modes are freely switchable.

Preferably, the plurality of dynamic memory cells are divided into a plurality of banks which can be operated independent from each other. The write/read circuit sets any of the plurality of banks to the first mode, and sets remaining banks to the second mode.

Therefore, mode switching bank by bank is possible. Therefore, the storage capacity and power consumption can be switched as desired, in accordance with the need.

Preferably, the semiconductor memory device further includes a pad and a selecting signal generating circuit. The selecting signal generating circuit generates the selecting signal indicating the first and second mode, in response to a voltage at the pad.

Therefore, it is possible to switch the mode by bonding option. This allows fixing of the mode.

Preferably, the semiconductor memory device further includes a fuse and the selecting signal generating circuit. The selecting signal generating circuit generates the selecting signal indicating the first and second modes in accordance with the fuse.

Therefore, it is possible to switch the mode by fuse option. This allows fixing of the mode.

Preferably, the semiconductor memory device further includes an internal power supply circuit. The internal power supply circuit receives an external power supply voltage, supplies a first internal power supply voltage lower than the external power supply voltage in the first mode, and supplies a second internal power supply voltage higher than the first internal power supply voltage and lower than the external power supply voltage in the second mode.

Therefore, the internal power supply voltage in the first mode is made lower than the internal power supply voltage in the second mode. Therefore, power consumption in the first mode can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
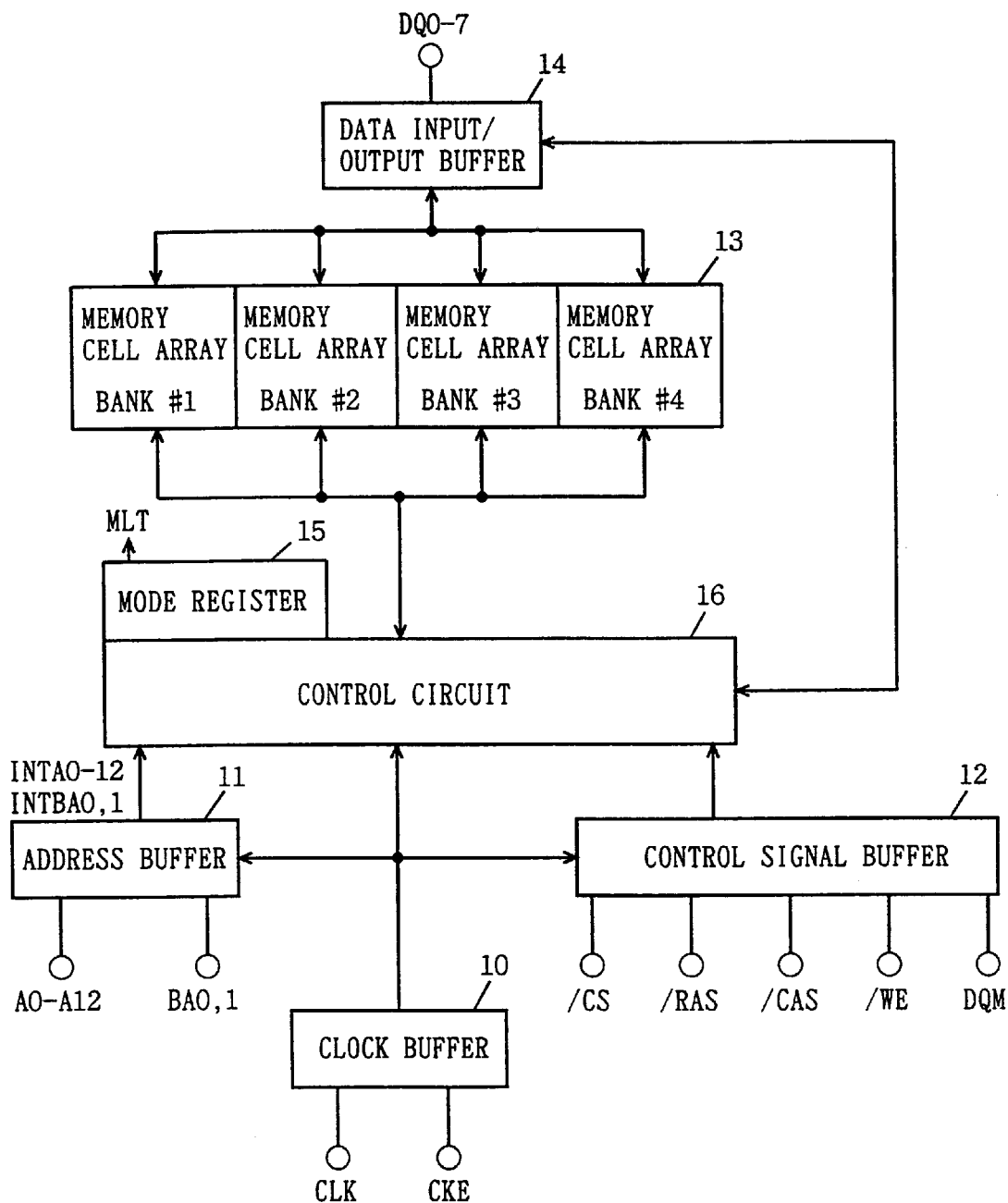
FIG. 1 is a block diagram showing an SDRAM configuration in accordance with a first embodiment of the present invention.

Embodiments of the present invention will be described in detail in the following with reference to figures.

In the figures, same or corresponding portions will be denoted by the same reference characters and description thereof will not be repeated.

First Embodiment

FIG. 1 is a block diagram showing a configuration of a synchronous dynamic random access memory, (SDRAM) in accordance with a first embodiment of the present invention. Referring to FIG. 1, the SDRAM operates in synchronization with an external clock signal CLK. The SDRAM includes a clock buffer 10, an address buffer 11, a control signal buffer 12, a memory cell array 13, a data input/output buffer 14, a mode register 15 and a control circuit 16.

Clock buffer 10 is activated in response to a clock enable signal CKE, and generates an internal clock signal in response to an external clock signal CLK. The internal clock signal is supplied to various internal circuits in the SDRAM including address buffer 11, control signal buffer 12 and control circuit 16.

Address buffer 11 generates internal address signals INTA0 to INTA12 in response to external address signals A0 to A12, and in response to external bank address signals BA0 and BA1, generates internal bank address signals INTBA0 and INTBA1.

Control signal buffer 12 generates various internal control signals in response to a chip select signal ICS, a row address strobe signal /RAS, column address strobe signal /CAS, a write enable signal /WE and an input/output data mask signal DQM.

Memory cell array 13 is divided into four banks #1 to #4.

Data input/output buffer 14 writes externally input data signals DQ0 to DQ7 to memory cell array 13, and externally outputs data signals DQ0 to DQ7 read from memory cell array 13.

Mode register 15 allows registration of externally set CAS (column address strobe signal) latency and the like and, among others, allows registration of a mode selecting signal MLT. The SDRAM enters the 4-value memory mode when the mode selecting signal MLT is at the H level, and enters the binary memory mode when the mode selecting signal MLT is at the L level, of which details will be described later.

Control circuit 16 controls overall internal circuitry of the SDRAM including memory cell array 13, data input/output buffer 14 and mode register 15. It is noted here that the control circuit 16 registers mode selecting signal MLT in mode register 15.

Figure 2:
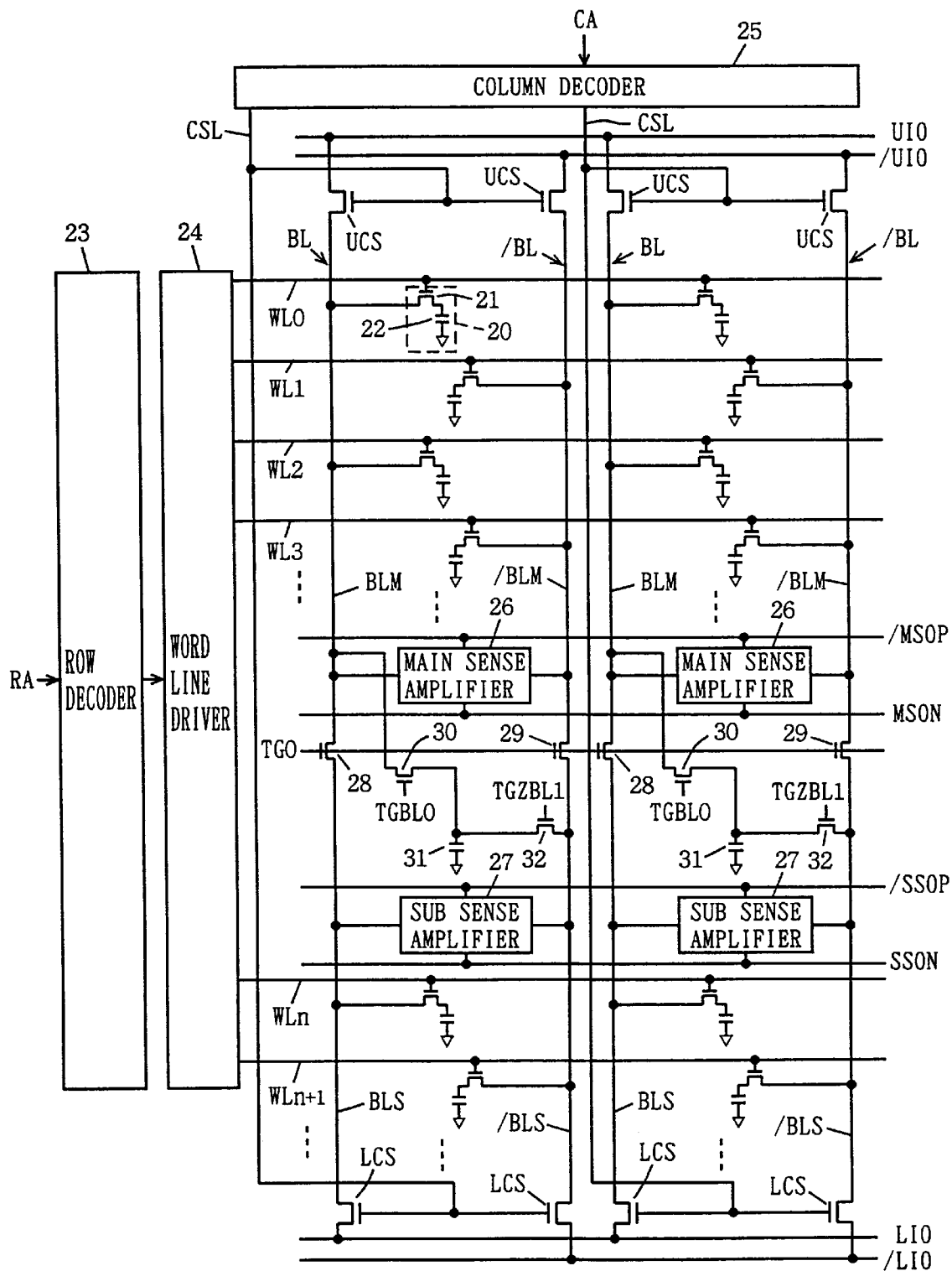
FIG. 2 is a block diagram showing configuration of each bank shown in FIG. 1.

FIG. 2 is a block diagram showing configuration of each of the banks #1 to #4 shown in FIG. 1. Referring to FIG. 2, each bank includes a plurality of dynamic memory cells 20 arranged in a plurality of rows and a plurality of columns, a plurality of word lines WL0 to WLn+1 arranged in a plurality of rows, and a plurality of bit line pairs BL, /BL arranged in a plurality of columns. Each of the memory cells 20 includes an access transistor 21 and a memory capacitor 22. Access transistor 21 is connected between the corresponding bit line BL or /BL and the memory capacitor 22, and has a gate connected to the corresponding word line. Each bit line pair BL, /BL includes a bit line BL and a bit line /BL complementary to bit line BL. Each bit line BL is divided into a main bit line BLM and a sub bit line BLS. Each bit line /BL is divided into a main bit line /BLM and a sub bit line /BLS. Each bank further includes a row decoder 23 for decoding a row address signal RA, a word line driver 24 for selectively driving word lines WL0 to WLn+1 in response to a decode signal from row decoder 23, and a column decoder 25 for selectively driving a column selecting line CSL in response to a column address signal CA.

Each bank further includes a plurality of main sense amplifiers 26 provided corresponding to the plurality of main bit line pairs BLM, /BLM, and a plurality of sub sense amplifiers 27 provided corresponding to the plurality of sub bit line pairs BLS, /BLS. Each main sense amplifier 26 is connected between the corresponding main bit line BLM and main bit line /BLM, and amplifies a potential difference generated therebetween. Each sub sense amplifier 27 is connected between the corresponding sub bit line BLS and sub bit line /BLS, and amplifies potential difference generated therebetween.

Each bank further includes an upper input/output line pair UIO, /UIO provided common to the plurality of main bit line pairs BLM, /BLM, are lower input/output line pair LIO, /LIO provided common to the plurality of sub bit line pairs BLS, /BLS, a plurality of column selecting gates UCS provided corresponding to the plurality of main bit line pairs BLM, /BLM, and a plurality of column selecting gates LCS provided corresponding to the plurality of sub bit line pairs BLS, /BLS. Each column selecting gate UCS is connected between the corresponding main bit line pair MBL, /MBL and the upper input/output line pair UIO, /UIO, and has a gate connected to the corresponding column selecting line CSL. Each column selecting gate LCS is connected to the corresponding sub bit line pair SBL, /SBL and the lower input/output line pair LIO, /LIO, and has a gate connected to the corresponding column selecting line CSL.

Each bank further includes N channel MOS transistors 28 and 29, an N channel MOS transistor 30, a reference capacitor 31 and an N channel MOS transistor 32. Transistor 28 is connected between main bit line BLM and sub bit line BLS. Transistor 29 is connected between main bit line /BLM and sub bit line /BLS. Transistor 30 is connected between main bit line BLM and reference capacitor 31. Transistor 32 is connected between sub bit line /BLS and reference capacitor 31.

Figure 3:
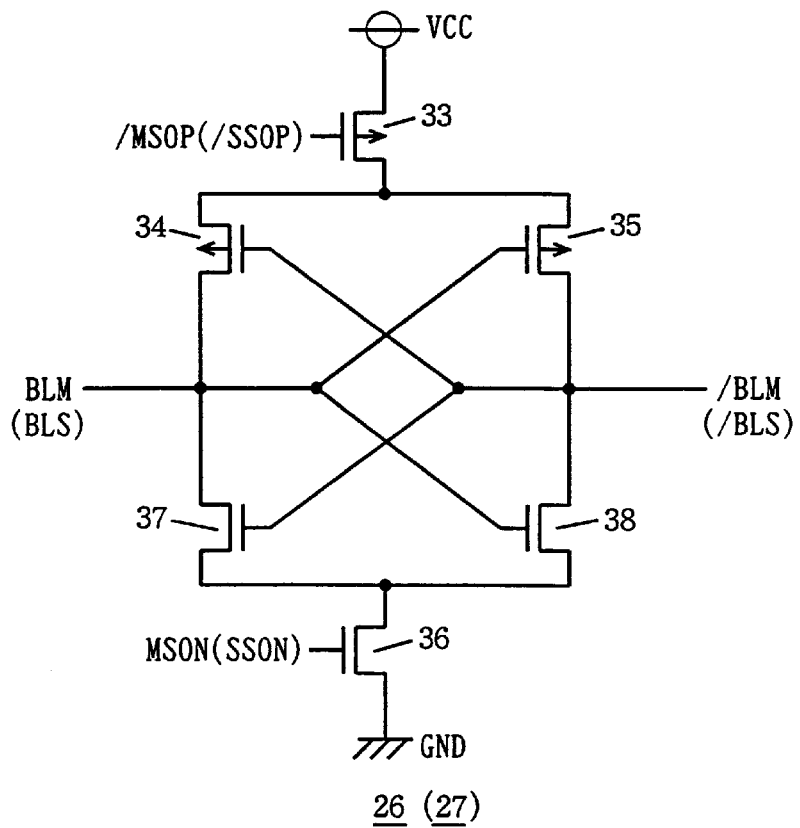
FIG. 3 is a schematic diagram showing a configuration of a main sense amplifier or a sub sense amplifier shown in FIG. 2.

FIG. 3 is a circuit diagram showing a configuration of main sense amplifier 26 or sub sense amplifier 27 shown in FIG. 2. Referring to FIG. 3, main sense amplifier 26 includes P channel MOS transistors 33 to 35 and N channel MOS transistors 36 to 38. Sub sense amplifier 27 has similar configuration as main sense amplifier 26. Main sense amplifier 26 and sub sense amplifier 27 both have the conventional configuration.

Figure 4:
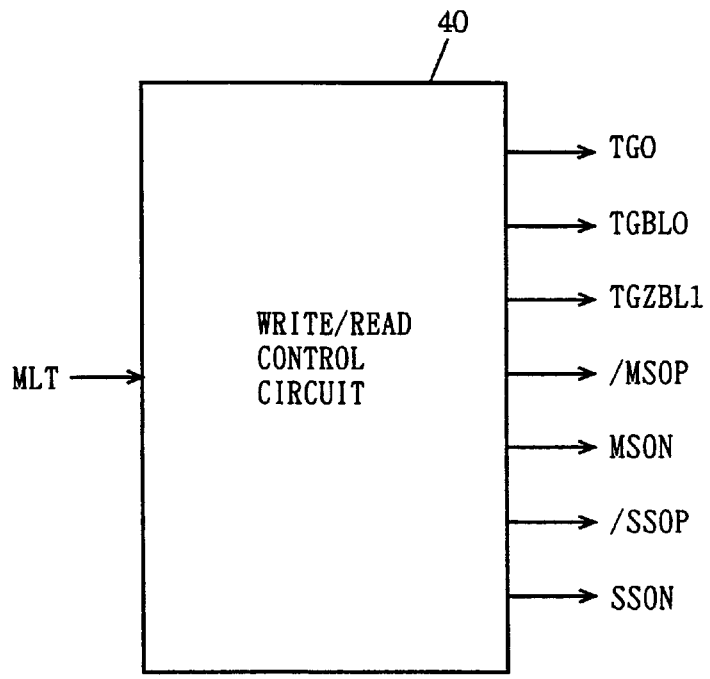
FIG. 4 is a block diagram showing a write/read control circuit for controlling the memory cell array shown in FIG. 1.

The SDRAM further includes such a write/read control circuit 40 as shown in FIG. 4. Write/read control circuit 40 generates control signals TG0, TGNL0, TGZBL1, /MS0P, /MS0N, /SS0P and SS0N, in response to mode selecting signal MLT. Control signal TG0 is applied to the gates of transistors 28 and 29 shown in FIG. 2. Control signal TGBL0 is applied to the gate of transistor 30. Control signal TGZBL1 is applied to the gate of transistor 32 shown in FIG. 2.

Control signal /MS0P is applied to the gate of transistor 33 in main sense amplifier 26 shown in FIG. 3. Control signal MS0N is applied to the gate of transistor 36 in main sense amplifier 26 shown in FIG. 3. Control signal /SS0P is applied to the gate of transistor 33 in sub sense amplifier 27 shown in FIG. 3. Control signal SS0N is applied to the gate of transistor 36 in sub sense amplifier 26 shown in FIG. 3.

Figure 5:
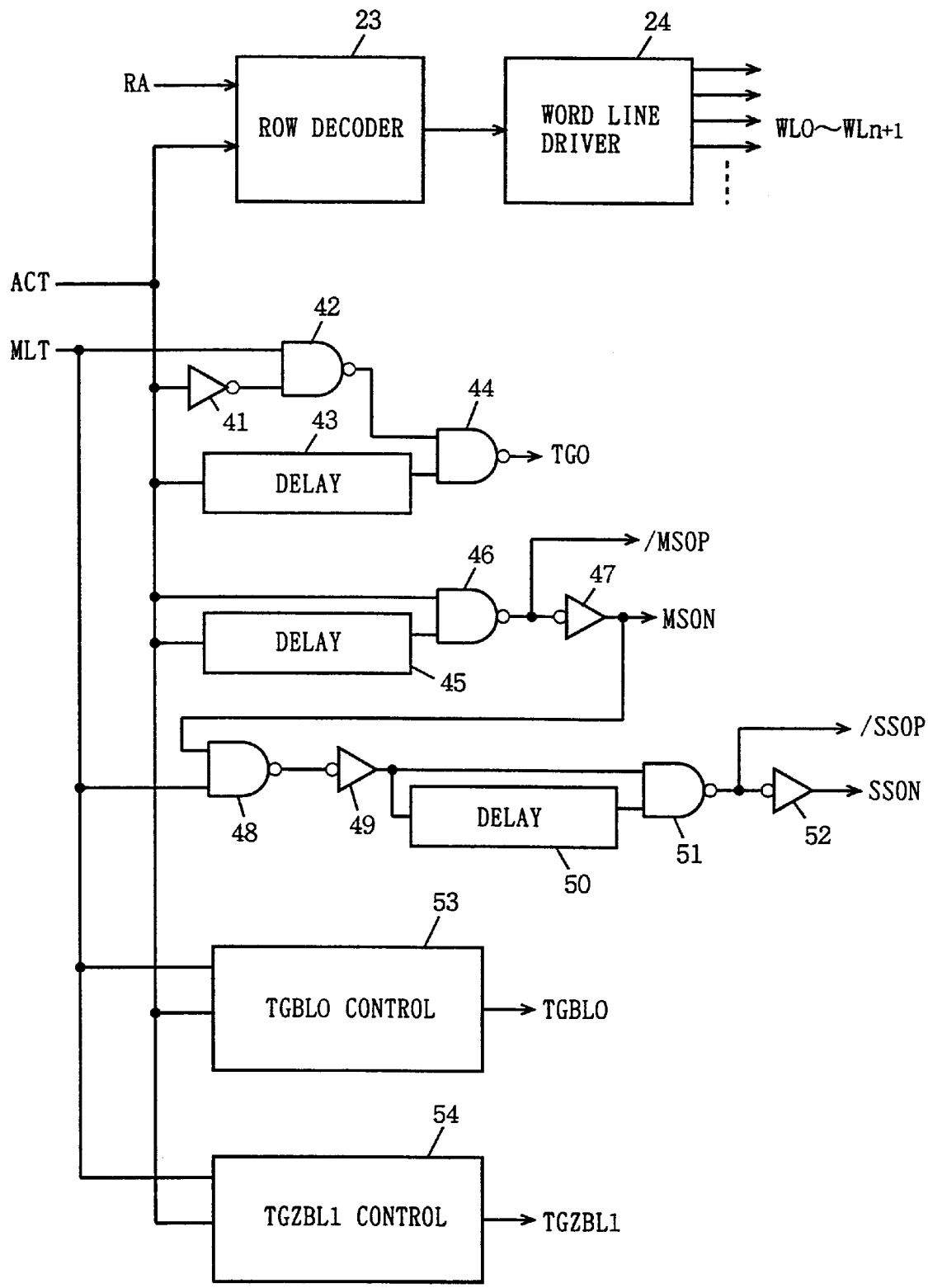
FIG. 5 is a block diagram showing a configuration of the read/write control circuit/shown in FIG. 4.

FIG. 5 is a block diagram showing configuration of write/read control circuit 40 shown in FIG. 4. Referring to FIG. 5, the write/read control circuit 40 includes an inverter circuit 41, an NAND circuit 42, a delay circuit 43 and an NAND circuit 44. These circuits 41 to 44 generate the control signal TG0 in response to an activating signal ATC and mode selecting signal MLT.

Write/read control circuit 40 further includes a delay circuit 45, an NAND circuit 46 and an inverter circuit 47. These circuits 45 to 47 generate control signals /MS0P and MS0N in response to the activating signal ACT.

Write/read control circuit 40 further includes an NAND circuit 48, an inverter circuit 49, a delay circuit 50, an NAND circuit 51 and an inverter circuit 52. These circuits 48 to 52 generate control signals /SS0P and SS0N in response to control signal MS0N and mode selecting signal MLT.

The wnite/read control circuit 40 further includes a TGBL0 control circuit 53 for controlling transistor 30 shown in FIG. 2, and a TGZBL1 control circuit 54 for controlling transistor 32 shown in FIG. 2. TGBL0 control circuit 53 generates control signal TGBL0 in response to the activating signal ACT and a mode selecting signal MLT. TGZBL1 control circuit 54 generates control signal TGZBL1 in response to activating signal ACT and mode selecting signal MLT.

Figure 6:
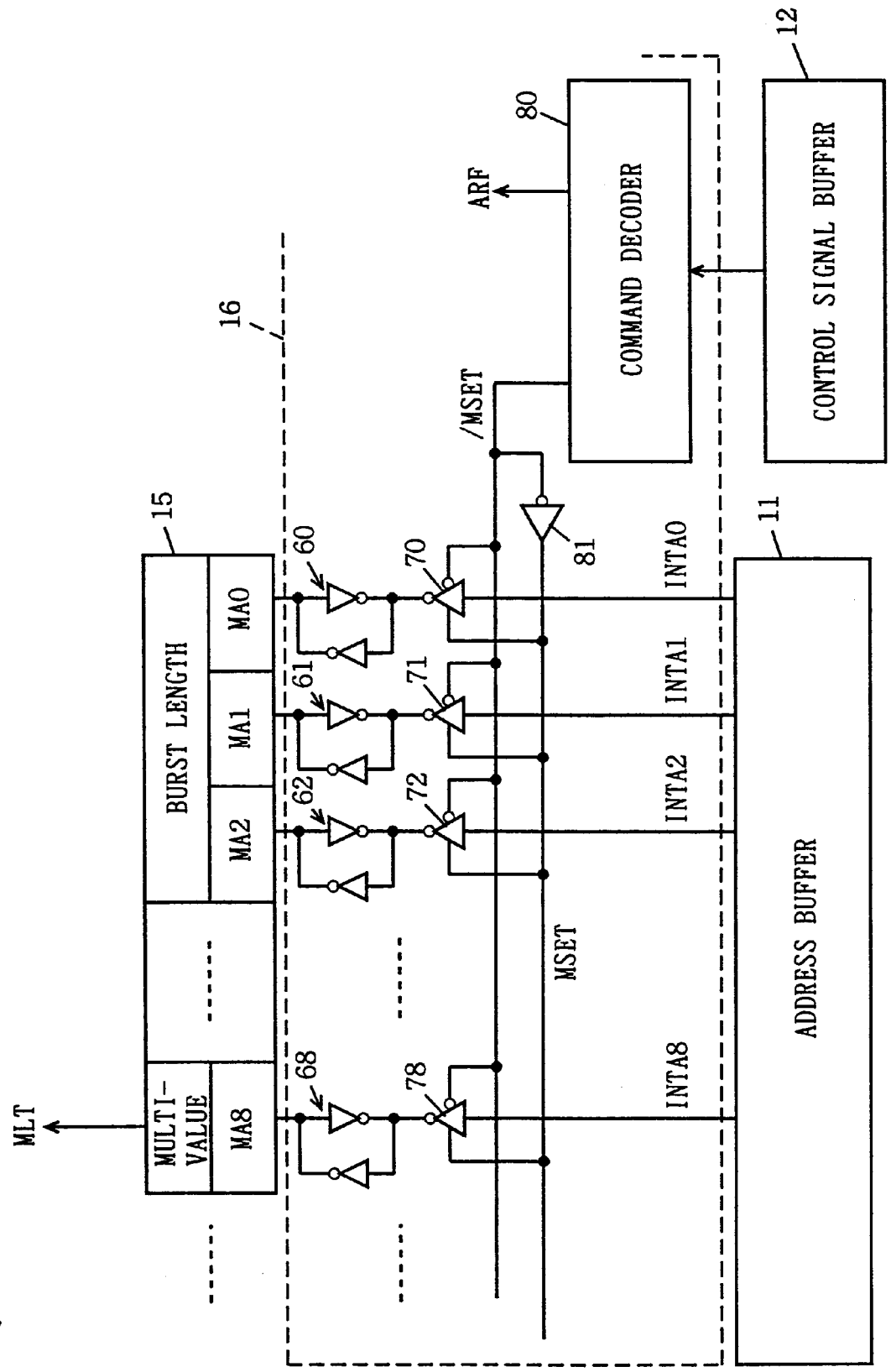
FIG. 6 is a block diagram showing a main configuration of a control circuit 16 shown in FIG. 1.

FIG. 6 is a block diagram showing configuration of control circuit 16 shown in FIG. 1. Referring to FIG. 6, control circuit 16 includes a plurality of latch circuits 60 to 68 provided corresponding to a plurality of bits MA0 to MA8 of mode register 15, a plurality of clocked inverter circuit 70 to 78 provided corresponding to the plurality of latch circuits 60 to 68, a command decoder 80 and an inverter circuit 81.

Each of the latch circuits 60 to 68 includes two inverter circuits connected to each other.

Clocked inverter circuits 70 to 78 transmit internal address signals INTA0 to INTA8 from address buffer 11 to latches 60 to 68, respectively.

Command decoder 80 decodes a command applied externally through control signal buffer 12, and generates a control signal in accordance with the command. When a mode register set command for allowing setting of mode register 15 is applied, for example, command decoder 80 generates a mode register set signal /MSET at the L level. The mode register set signal /MSET is directly applied to clocked inverter circuits 70 to 78 and inverted by inverter circuit 81 to be a mode register set signal MSET, which is applied to clocked inverter circuits 70 to 78. When an auto refresh executing command for instructing execution of refreshing is applied externally, for example, command decoder 80 generates an auto refresh signal ARF.

Figure 7:
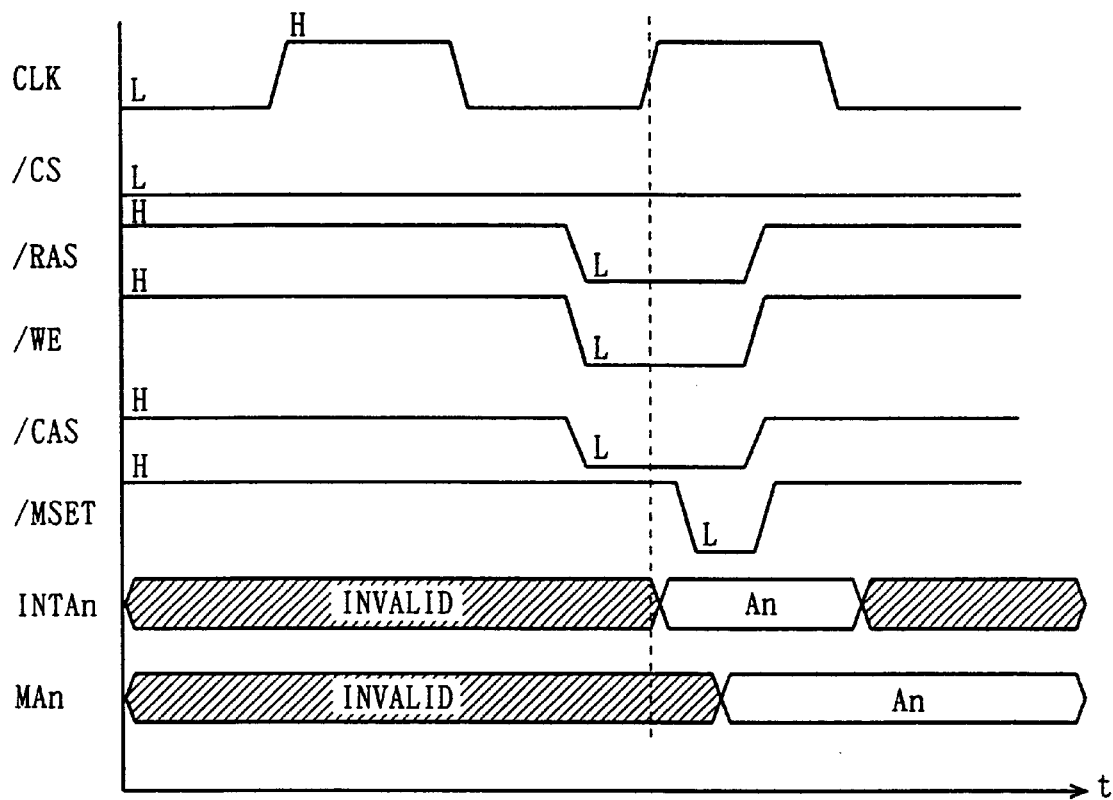
FIG. 7 is a timing chart showing an operation of the control circuit 16 shown in FIG. 6.

As shown in FIG. 7, when the chip selector signal /CS is at the L level, the row address strobe signal /RAS is at the L level, the write enable signal /WE is at the L level and the column address strobe signal /CAS is at the L level at the rise of the clock signal CLK, command decoder 80 recognizes these signals as a mode register set command. Accordingly, the mode register set signal /MSET which is kept at the L level for a prescribed time period is generated. In response to the mode register set signal /MSET at the L level, clocked inverter circuits 70 to 78 are activated, and internal address signals INTA0 to INTA8 are latched in latch circuits 60–68, respectively. The signals latched in latch circuits 60–68 are registered in bits MA0 to MA8 of mode register 15. Among these bits, bits MA0 to MA2 represent burst length, for example. Though bit MA8 is not used in the conventional SDRAM, here it is used to represent the multi-value memory mode. More specifically, when an H level signal is registered in bit MA8, the SDRAM enters the 4-value memory mode, and when an L level signal is registered in bit MA8, the SDRAM enters the binary memory mode. Therefore, when the SDRAM is to be used in the 4-value memory mode, the external address signal A8 is set to the H level, and when it is to be used in the binary memory mode, the external address signal A8 is set to the L level. The bit MA8 of mode register 15 is supplied as mode selecting signal MLT to write/read control circuit 40 shown in FIGS. 4 and 5.

Figure 8:
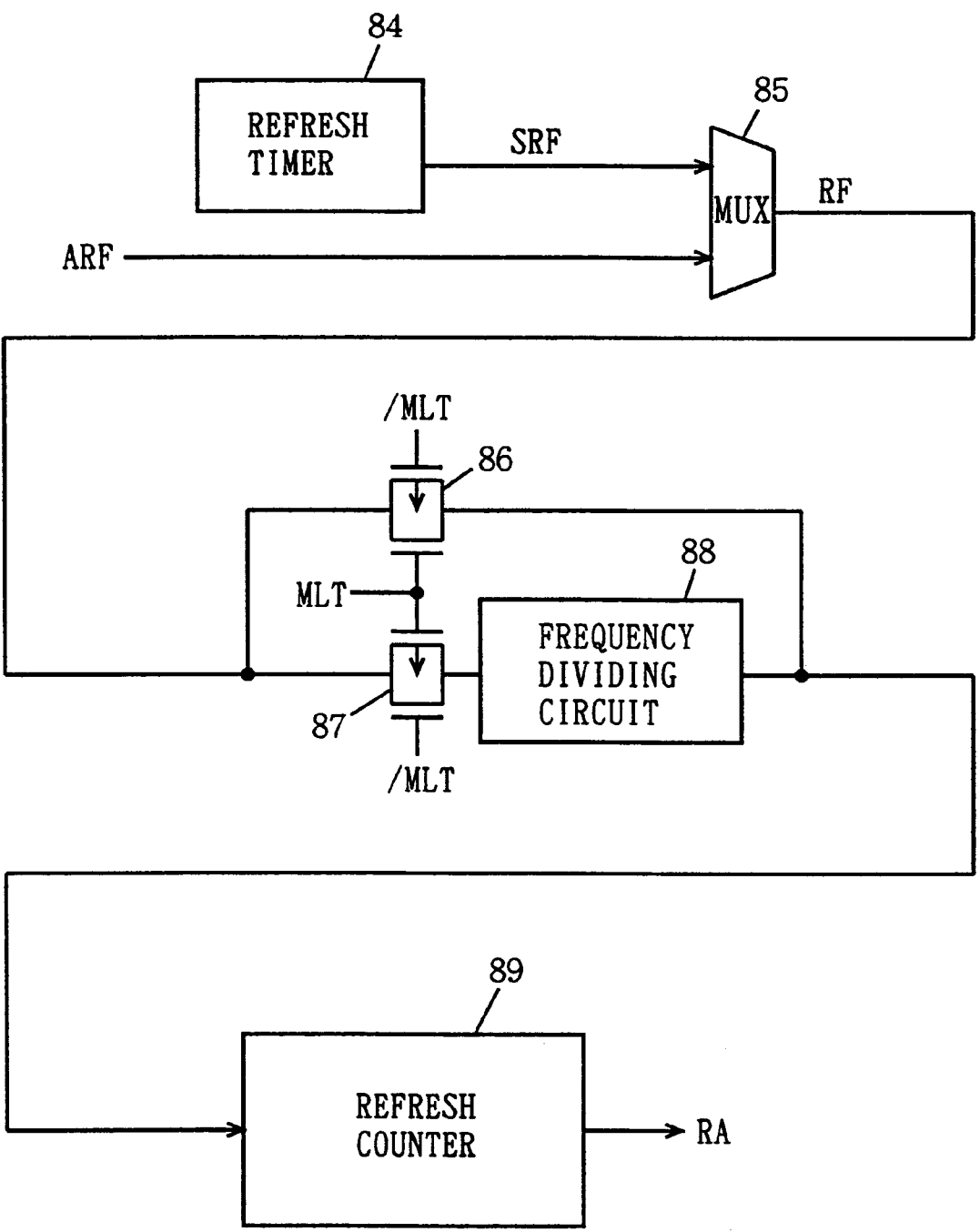
FIG. 8 is a block diagram showing a circuit for refreshing the memory cell array shown in FIG. 1.

FIG. 8 is a block diagram showing a circuit for refreshing memory cell array 13 shown in FIG. 1. There are self refresh mode and auto refresh mode here.

Referring to FIG. 8, the SDRAM further includes a refresh timer 84, a multiplexer (MUX) 85, transfer gates 86 and 87, a frequency dividing circuit 88 and a refresh counter 89. Refresh timer 84 generates a self refresh signal SRF at a predetermined refresh period. Multiplexer 85 receives the self refresh signal SRF from refresh timer 84 and the auto refresh signal ARF from command decoder 80 shown in FIG. 6, and selects the self refresh signal SRF in the self refresh mode, and selects the auto refresh signal ARF in the auto refresh mode. The refresh signal RF selected by multiplexer 85 is supplied to transfer gates 86 and 87. Transfer gates 86 and 87 turn on/off in response to the mode selecting signal MLT from mode register 15. In the 4-value mode, in response to the H level mode selecting signal MLT and the L level mode selecting signal /MLT, transfer gate 86 turns on and transfer gate 87 turns off. In the binary memory mode, in response to the L level mode selecting signal MLT and the H level mode selecting signal /MLT, transfer gate 86 turns off and transfer gate 87 turns on. Therefore, frequency dividing circuit 88 divides the refresh signal RF supplied from multiplexer 85 at a prescribed ratio of frequency division (for example, ⅓) in the binary memory mode.

Refresh counter 89 successively generates the row address signal RA in response to the refresh signal RF directly supplied from multiplexer 85 or in response to the refresh signal RF frequency-divided by the frequency dividing circuit 88.

Figure 9:
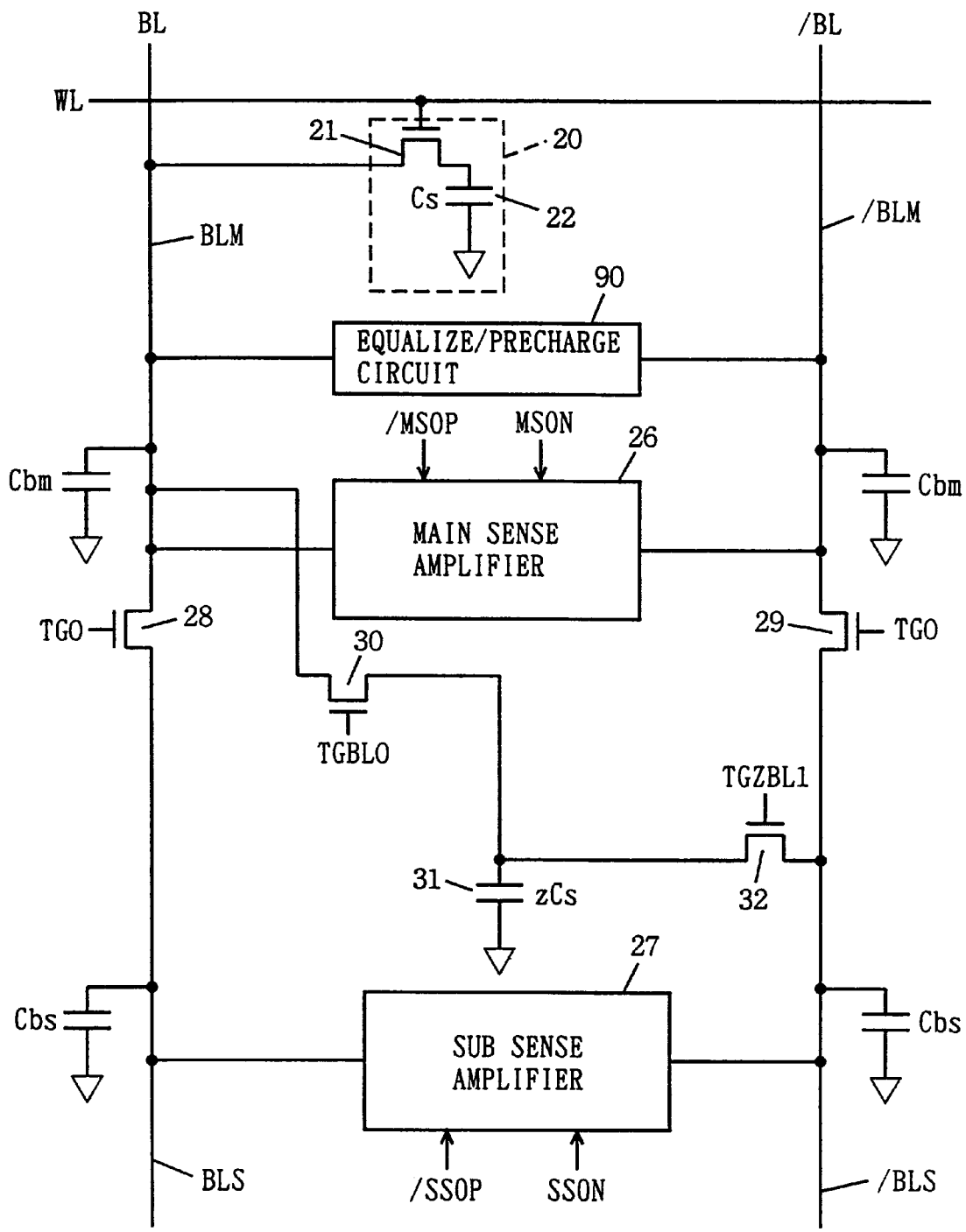
FIG. 9 is a block diagram showing a portion of the memory cell array shown in FIG. 2.

The operation of the SDRAM having the above described configuration will be described in the following. Here, the capacitors of memory capacitor 22 is represented as Cs, parasitic resistance of each of main bit lines BLM and /BLM as Cbm, parasitic capacitance of each of the sub bit lines BLS and /BLS as Cbs, and capacitance of a reference capacitor 31 as zCs (z times the capacitance Cs of memory capacitor 22), as shown in FIG. 9.

(1) In the 4-value memory mode

Figure 10:
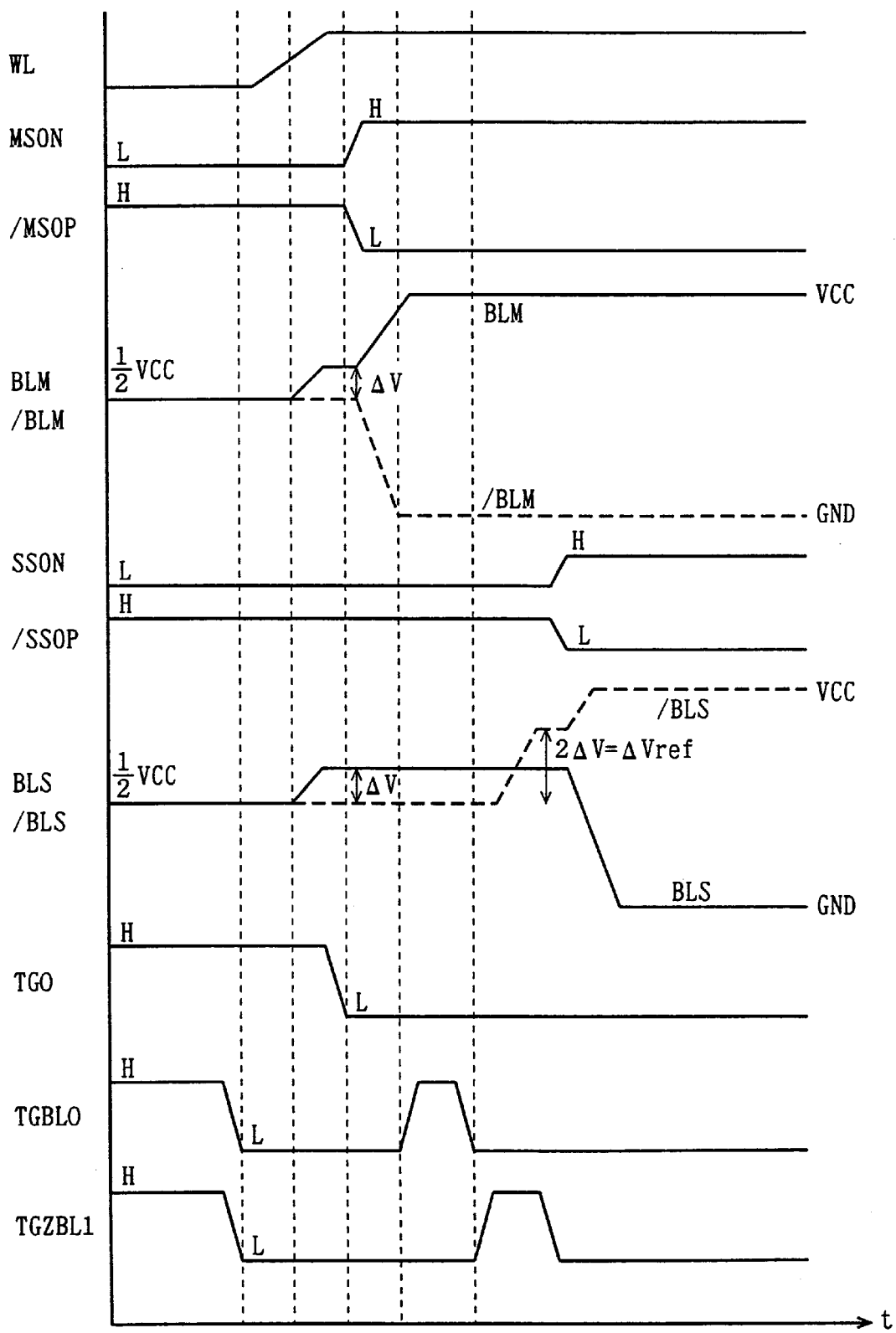
FIG. 10 is a timing chart showing a read operation when a memory capacitor is charged to (⅔) VCC in the memory cell array shown in FIG. 9.
Figure 11:
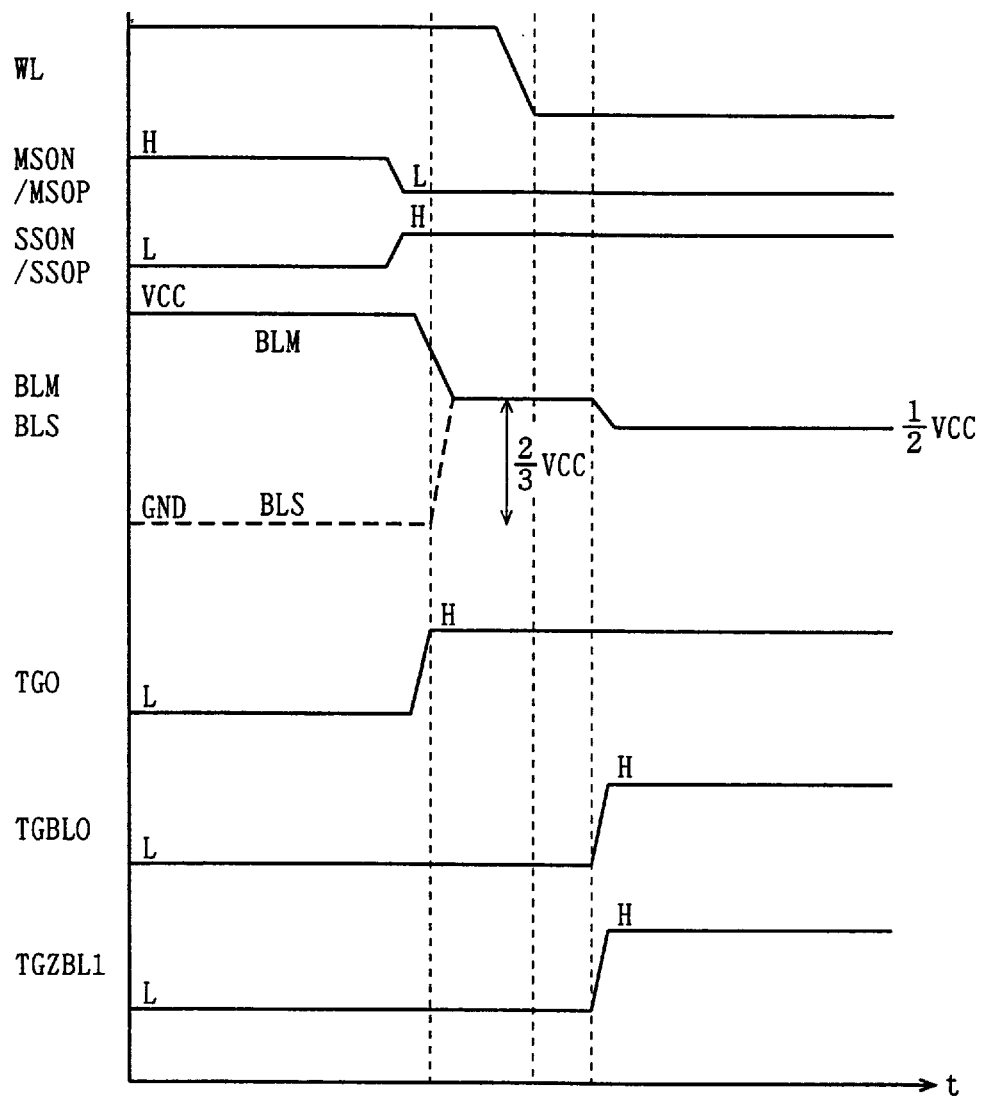
FIG. 11 is a timing chart showing a restore operation following FIG. 10.
Figure 12:
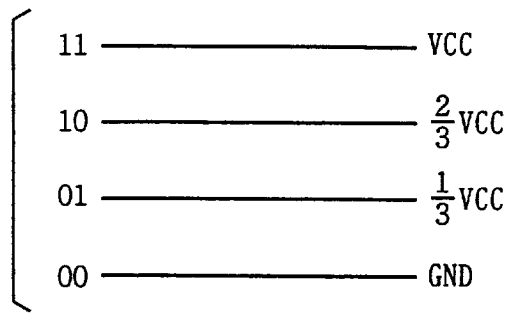
FIG. 12 shows correspondence between data signal bits and charged voltages when the memory cell shown in FIG. 9 is used as a 4-value memory.
Figure 13:
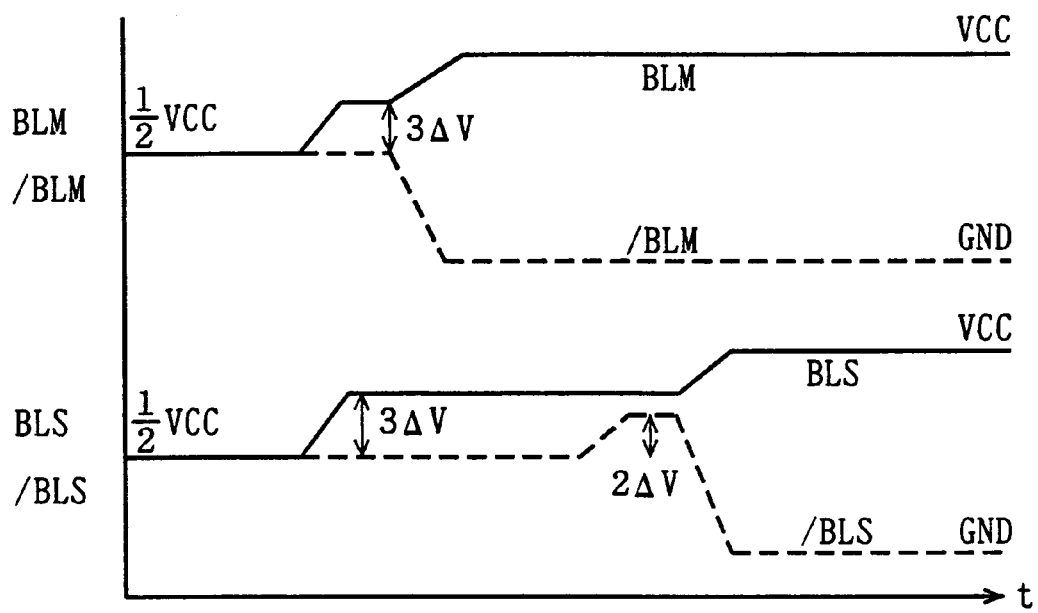
FIG. 13 is a timing chart showing a read operation when the memory capacitor is charged to VCC in the memory cell array shown in FIG. 9.

The SDRAM is set in the 4-value memory mode, an H level signal is registered in bit MA8 of mode register 15 shown in FIG. 6. Consequently, an H level mode selecting signal MLT is generated from mode register 15. The H level mode selecting signal MLT is supplied to write/read control circuit 40 shown in FIG. 4, more specifically, to NAND circuit 42, NAND circuit 48, TGBL0 control circuit 53 and TGZBL1 control circuit 54 in write/read control circuit 40 in FIG. 5. In response, write/read control circuit 40 generates control signals TG0, MS0N, /MS0P, SS0N, /SS0P, TGBL0 and TGZBL1 as shown in FIGS. 10 and 11. In the multi memory mode, referring to FIG. 12, memory capacitor 22 is charged to VCC, (⅔) VCC, (⅓) VCC or GND, and a data signal of 2 bits is written to one dynamic memory cell. Here, VCC corresponds to a data signal of (11), (⅔) VCC corresponds to a data signal of (10), (⅓) VCC corresponds to a data signal of (01) and GND corresponds to a data signal of (00).

Referring to the timing chart of FIG. 10, an operation when a data signal of (10) is read from memory cell 20 will be described in the following.

Before a read or a refresh request signal is generated from command decoder 80 shown in FIG. 6, control signals TG0, TGBL0 and TGZBL1 are all at the H level. Control signal MS0N is at the L level and control signal MS0P is at the H level. At this time, control signal SS0N is at the L level, and control signal /SS0P is at the H level. At this time, bit lines BL and /BL are equalized and precharged to (½) VCC by an equalize/precharge circuit 90. Therefore, voltages of main bit lines BLM and /BLM as well as sub bit lines BLS and /BLS are all at (½) VCC.

When a read or a refresh request signal is generated from command decoder 80, first, control signals TGBL0 and TGZBL1 attain to the L level, and transistors 30 and 32 turn off.

Thereafter, by word line driver 24 shown in FIGS. 2 and 5, the voltage of word line WL is raised, and access transistor 21 turns on. Accordingly, charges which have been stored in memory capacitor 22 flow out to main bit line BLM and sub bit line BLS. More specifically, all the charges stored in capacitances Cs, Cbm and Cbs are re-distributed to the capacitances Cs, Cbm and Cbs. Here, as memory capacitor 22 is charged to (⅔) VCC, the following equation (1) holds assuming that the voltages of main bit line BLM and sub bit line BLS after re-distribution are $n_1$ VCC ($n_1$ times the power supply voltage VCC).

$$½(Cbm+Cbs)Vcc+⅔CsVcc = (Cbm+Cbs+Cs)n_1Vcc \quad (1)$$

Therefore, the voltage n1 VCC after re-distribution can be represented by the following equation (2).

$$n_1 Vcc = \frac{\frac{1}{2}(Cbm+Cbs)+\frac{2}{3}Cs}{Cbm+Cbs+Cs}Vcc \quad (2)$$

As the voltage of the other main bit line /BLM and the other sub bit line /BLS are kept at (½) VCC, there is generated a potential difference ΔV represented by the following equations (3) and (4) between the main bit lines BLM and /BLM (between sub bit lines BLS and /BLS).

$$\Delta V = n_1 Vcc - \frac{1}{2}Vcc \quad (3)$$

$$= \frac{CsVcc}{6(Cbm+Cbs+Cs)} \quad (4)$$

Thereafter, when the control signal TG0 attains to the L level, transistors 28 and 29 turn off, and sub bit lines BLS and /BLS are electrically separated from main bit lines BLM and /BLM.

Thereafter, when control signal MS0N attains to the H level and control signals /MS0P attains the L level, main sense amplifier 26 starts its operation, the voltage of main bit line BLM at the higher potential side attains to the power supply voltage VCC and the voltage of main bit line /BLM at a lower potential side attains to the ground voltage GND. At this time, as sub bit lines BLS and /BLS are separated from main bit lines BLM and /BLM, potential difference between the sub bit lines BLS and /BLS is kept at ΔV.

After amplification by main sense amplifier 26 is complete, control signal TGBL0 attains to and kept at the H level for prescribed time period and, in response, transistor 30 turns on. At this time, the voltage of main bit line BLM is fixed at the power supply voltage VCC by main sense amplifier 26, and therefore reference capacitor 31 is charged to VCC.

After a control signal TGBL0 returns to the L level, control signal TGZBL1 attains to and kept at the H level for a prescribed time period and, in response, transistor 32 turns on. Consequently, total charges stored in capacitances zCs and Cbs are re-distributed to these capacitances zCs and Cbs. As the capacitance zCs is charged to VCC and capacitance Cbs is charged to (½) VCC, the following equation (5) holds, where $n_2$ VCC represents the voltage of sub bit line /BLS after re-distribution.

$$\frac{1}{2}VccCbs + zCsVcc = (Cbs + zCs)n_2Vcc \qquad (5)$$

Therefore, the voltage $N_2$ VCC after re-distribution can be given by the following equation (6).

$$n_2Vcc = \frac{\frac{1}{2}Cbs + zCs}{Cbs + zCs} \qquad (6)$$

Therefore, fluctuation voltage ΔVref generated at sub bit line /BLS is represented by the following equations (7) and (8).

$$\Delta Vref = nVcc - \frac{1}{2}Vcc \qquad (7)$$

$$= \frac{zCs}{2(Cbs + zCs)} \qquad (8)$$

Assuming that parasitic capacitance Cbm of main bit line BLM is m times the capacitance Cs of memory capacitor 22 (Cbm=mCs), the parasitic capacitance Cbs of sub bit line is s times the capacitance Cs of memory capacitor 22 (Cbs=sCs) and that the following equation (9) holds, then the following equation (10) results.

$$\Delta Vref = 2\Delta V \qquad (9)$$

$$\frac{z}{2(s + z)} = \frac{1}{3(m + s + 1)} \qquad (10)$$

When it is assumed that m=1.5 and s=1.5, then z=3/10.

Thereafter, when control signal SS0N attains to the H level and control signal SS0P attains to the L level, sub sense amplifier 27 starts its operation, the voltage of sub bit line /BLS on the higher potential side attains to the power supply voltage VCC, and voltage of sub bit line BLS at the lower potential side attains to the ground voltage GND.

The data signal read to main bit line pair BLM and /BLM is externally output through column selecting gate UCS, upper input/output line pair UIO, /UIO shown in FIG. 2 and data input/output buffer 14 shown in FIG. 1. The data signal read to the sub bit line pair BLS and /BLS is externally output through column selecting gate LCS and lower input/output line pair LIO and /LIO shown in FIG. 2 as well as through data input/output buffer shown in FIG. 1. When memory capacitor 22 is charged to (⅔) VCC as described above, a data signal of 2 bits (10) is output.

A data signal restoring operation will be described with reference to the timing chart of FIG. 11.

After the data signal is output, when control signal MS0N attains to the L level, control signal /MS0P attains to the H level, control signal SS0N attains to the H level and control signal /SS0P attains to the L level, main sense amplifier 26 and sub sense amplifier 27 stop operation. Thereafter, when control signal TG0 attains to the H level, transistors 28 and 29 turn on, and charges are re-distributed between main bit line BLM and sub bit line BLS. Here, the voltage of main bit line BLM is VCC and the voltage of sub bit line BLS is GND (OV), therefore, it is necessary that the following equation (11) holds in order to charge memory capacitor 22 again to (⅔) VCC.

$$VccCs + VccCbm = \frac{2}{3}Vcc(Cs + Cbm + Cbs) \qquad (11)$$

As described above, Cbm=mCs and Cbs=sCs, and therefore the equation (11) can be modified to the following equations (12) and (13).

$$1 + m = \frac{2}{3}(1 + m + s) \qquad (12)$$

$$m = 2s - 1 \qquad (13)$$

When memory capacitor 22 is charged to VCC, that is, when the data signal of (11) is stored in memory cell 20, a potential difference of 3ΔV is generated between the main bit lines BLM and /BLM as well as between sub bit lines BLS and /BLS. Therefore, the voltage of main bit line BLM is amplified to power supply voltage VCC and the voltage of main bit line /BLM is amplified to the ground voltage GND by main sense amplifier 26. The voltage of sub bit line BLS is amplified to power supply voltage VCC and the voltage of sub bit line /BLS is amplified to GND by sub sense amplifier 27.

Therefore, in this case, a data signal of (11) is output.

Figure 14:
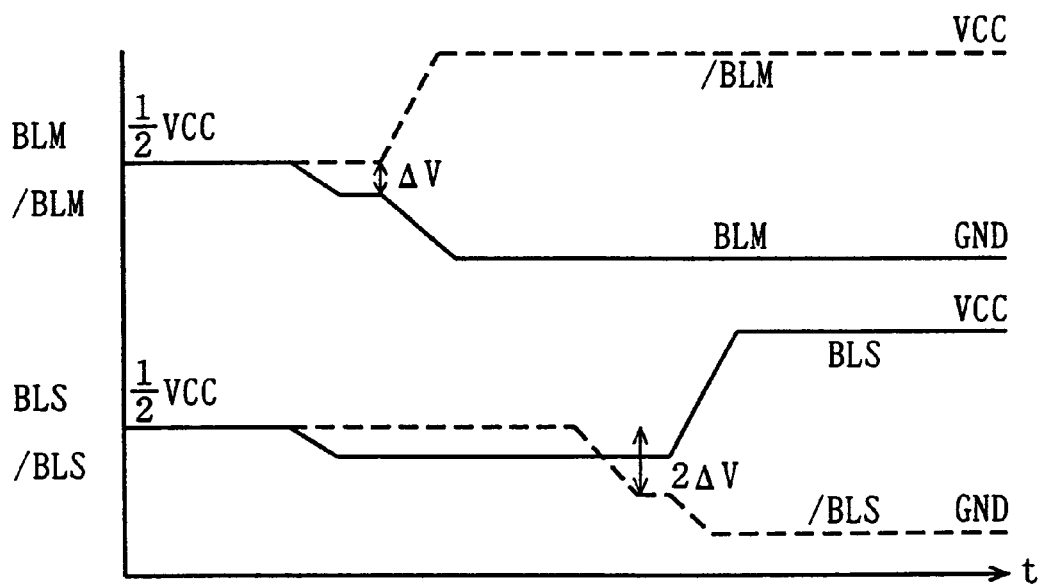
FIG. 14 is a timing chart showing a read operation when the memory capacitor is charged to (⅓) VCC in the memory cell array shown in FIG. 9.

When memory capacitor 22 is charged to (⅓) VCC, that is, when the data signal of (01) is stored in memory cell 20, a potential difference of 3ΔV is generated between main bit lines BLM and /BLM and between sub bit lines BLS and /BLS, as shown in FIG. 14. In this case, the voltage of main bit line BLM lowers, and therefore the voltage of main bit line BLM is amplified to the ground voltage GND and the voltage of main bit line /BLM is amplified to the power supply voltage VCC, by main sense amplifier 26. Further, in this case, as a voltage of sub bit line /BLS lowers, the voltage of sub bit line BLS is amplified to the power supply voltage VCC and the voltage of sub bit line /BLS is amplified to the ground voltage GND, by sub sense amplifier 27.

Therefore, in this case, the data signal of (01) is output.

Figure 15:
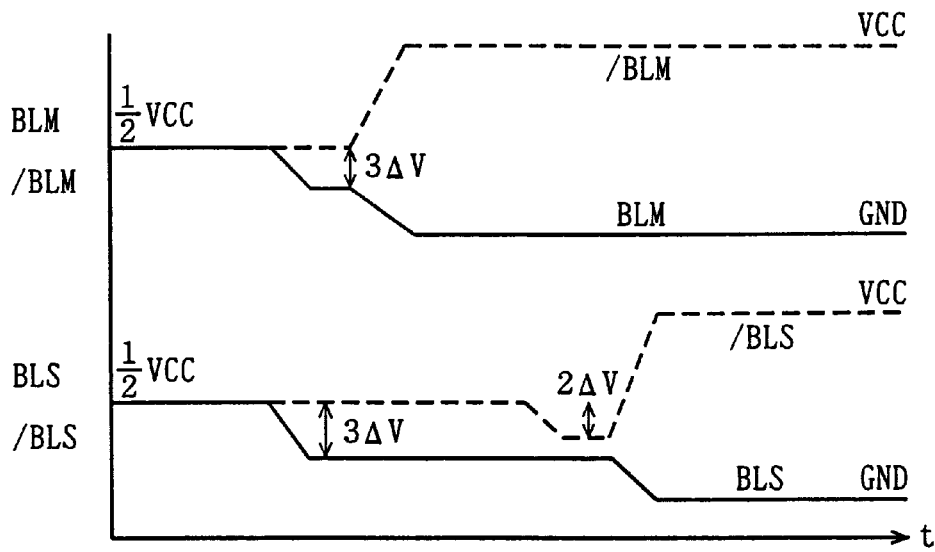
FIG. 15 is a timing chart showing a read operation when the memory capacitor is char ed to the GND in the memory cell array shown in FIG. 9.

When memory capacitor 22 is charged to the ground value GND, that is, when the data signal of (00) is stored is memory cell 20, the voltages of main bit line BLM and sub bit line BLS decrease by 3ΔV, as shown in FIG. 15. Therefore, the voltage of main bit line BLM is amplified to the ground voltage GND, and the voltage of main bit line /BLM is amplified to the power supply voltage VCC by main sense amplifier 26. The voltage of sub bit line BLS is amplified to the ground voltage GND and the voltage of sub bit lines /BLS is amplified to the power supply voltage VCC, by sub sense amplifier 27.

Therefore, in this case, the data signal of (00) is output.

As described above, in the 4-value memory mode, a data signal of 2 bits is written to one memory cell 20, and a data signal of 2 bits is read from one memory cell. When memory capacitor 22 is charged to VCC, the data signal of (11) is read, when the memory capacitor 22 is charged to (⅔) VCC, a data signal of (10) is read, when the memory capacitor is charged to (⅓) VCC, a data signal of (01) is read and when charged to GND, a data signal of (00) is read, as shown in Table 1 below.

| | BLM | |
|---|---|---|
| BLS | VCC | GND |
| VCC | VCC (11) | (1/3) VCC (01) |
| GND | (2/3) VCC (10) | GND (00) |

In the 4 value memory mode, mode selecting signal MLT attains to the H level and, therefore, transfer gate 86 shown in FIG. 8 turns on and transfer gate 87 turns off. Accordingly, refresh signal RF from multiplexer 85 is directly applied to refresh counter 89, not through the frequency dividing circuit 88. Therefore, in response to the non-divided refresh signal RF, refresh counter 89 generates the row address signal RA.

In the self refresh mode, the self refresh signal SRF from refresh timer 84 is applied as the refresh signal RF to refresh counter 89. Therefore, refreshing is performed at a predetermined period. In the auto refresh mode, the auto refresh signal ARF from command decoder 80 is applied as the refresh signal RF to refresh counter 89, and therefore refreshing is performed at a period of an externally applied auto refresh command.

(2) In binary memory mode

Figure 16:
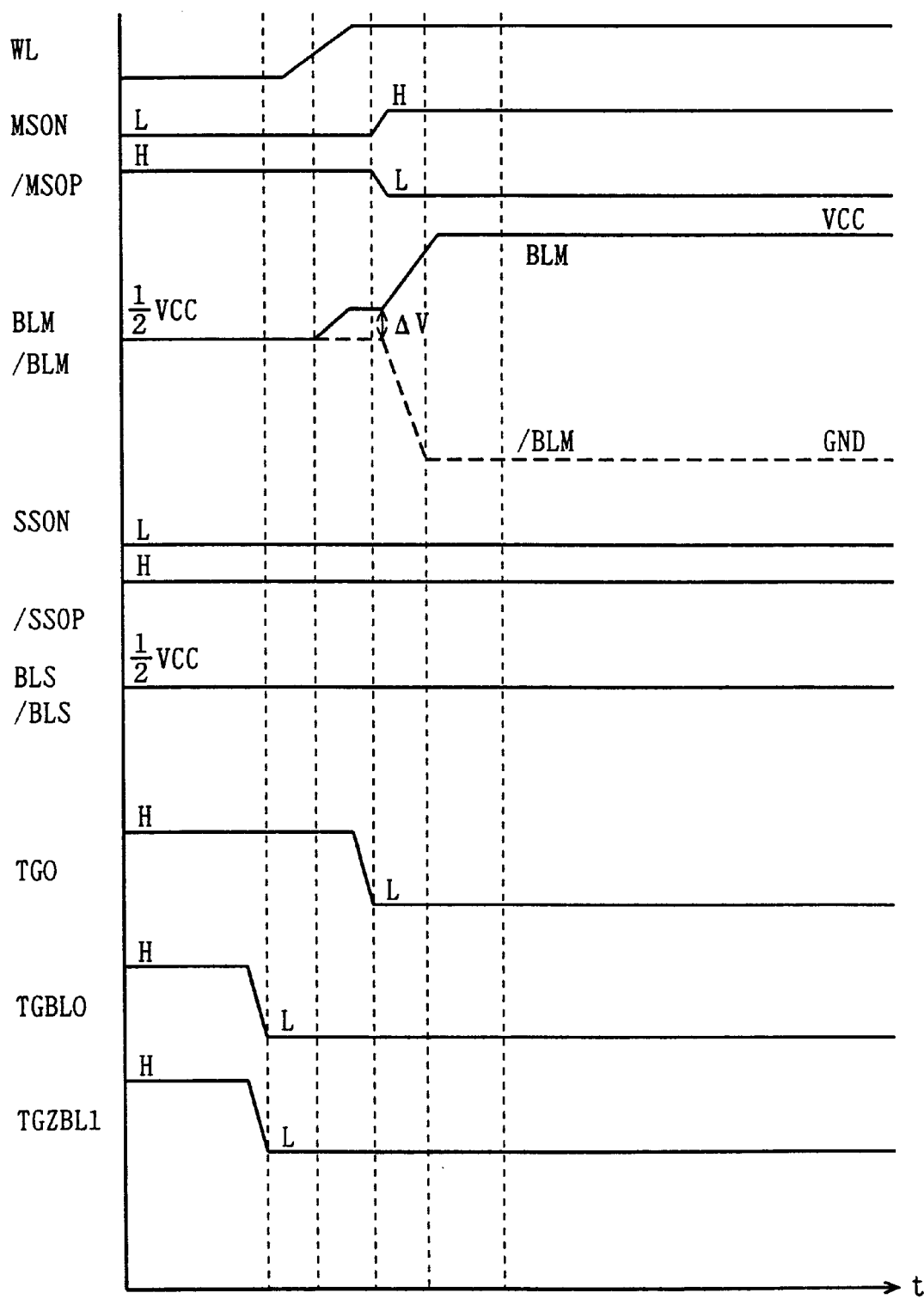
FIG. 16 is a timing chart showing a read operation when the memory cell shown in FIG. 9 is used as a binary memory.
Figure 17:
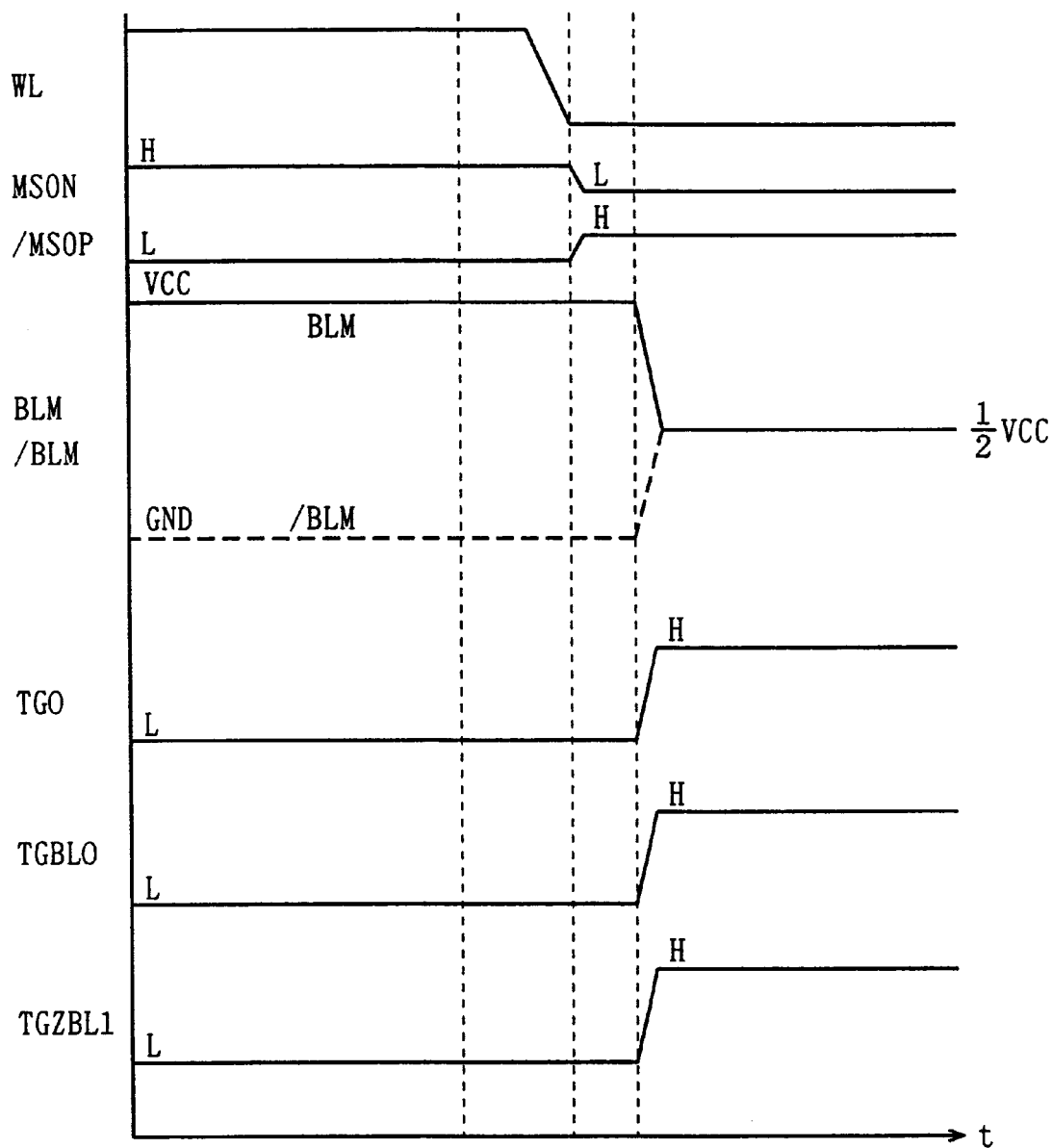
FIG. 17 is a timing chart showing a restore operation following FIG. 16.

When the SDRAM is to be set in the binary memory mode, an L level signal is registered in bit MA8 of mode register 15 shown in FIG. 6. Consequently, an L level mode selecting signal MLT is generated from mode register 15. The L level mode selecting signal MLT is applied to write/read control circuit 40 shown in FIGS. 4 and 5. When the mode selecting signal MLT is at the L level, write/read control circuit 40 generates control signals MS0N, /MS0P, SS0N, /SS0P, THO, TGBL0 and TGZBL1 as shown in FIGS. 16 and 17. In this case, as the L level mode selecting signal MLT is applied to the NAND circuit 48 in write/read control circuit 40, control signal SS0N is kept at the L level, and control signal /SS0P is maintained at the H level. Therefore, sub sense amplifier 27 is not activated.

The read operation will be described with reference to the timing chart of FIG. 16.

Before the rise of word line WL, control signals TG0, TGBL0 and TGZBL1 are all at the H level, and main bit lines BLM and /BLM as well as sub bit lines BLS and /BLS are precharged to (½) VCC.

Thereafter, control signals TGBL0 and TGZBL1 attain to the L level, and transistors 30 and 32 turn off. In the binary memory mode, transistors 30 and 32 are kept off until completion of restoring of the data signal.

When the word line WL rises thereafter, there is generated a potential difference ΔV between main bit lines BLM and /BLM. Assuming that memory capacitor 22 is charged to VCC in FIG. 16, the voltage of main bit line BLM has been increased. Therefore, when memory capacitor 22 is charged to GND, the voltage of main bit line BLM decreases. As charges of memory capacitor 22 flow out with the sub bit lines BLS and /BLS being connected to main bit lines BLM and /BLM, the potential difference ΔV generated here is the same as that in the 4-value memory mode described above.

Thereafter, control signal TG0 attains to the L level, and transistors 28 and 29 turn off. Consequently, sub bit lines BLS and /BLS are separated from the main bit lines BLM and /BLM. Here, sub bit lines BLS and /BLS are separated from main bit lines BLM and /BLM in order to ease load at the time of amplification by main sense amplifier 26. Therefore, if it is not necessary to reduce load at the time of amplification, control signal TG0 may be kept at the H level.

Then, when control signal MS0N attains to the H level and control signal IMS0P attains to the L level, main sense amplifier 26 starts its operation, main bit line BLM attains to the power supply voltage VCC and main bit line /BLM attains to the ground GND.

In this manner, the data signal read to the main bit line pair BLM, /BLM is externally output through column selecting gate UCS and upper input/output line pair UIO, /UIO shown in FIG. 2 and data input/output buffer 14 shown in FIG. 1. As the main bit line BLM is at the power supply voltage VCC in the example of FIG. 16, a 1 bit data signal of (1) is output. When memory capacitor 22 is charged to the ground voltage GND, the voltage of main bit line BLM is at the ground voltage GND, and therefore, in that case, 1 bit data signal of (0) is output.

A data signal restoring operation will be described with reference to the timing chart of FIG. 17.

The word line WL falls before main sense amplifier 26 stops its operation when control signal MS0N attains to the L level and control signal MS0P attains to the H level. Therefore, the voltage of main bit line BLM is fixed at the power supply voltage VCC, and therefore main capacitor 22 is again charged to VCC.

As described above, in the binary memory mode, 1 bit data signal is written to one memory cell 20 and 1 bit data signal is read from one memory cell 20.

Further, in the binary memory mode, mode selecting signal MLT attains to the L level, and therefore transfer gates 86 and 87 shown in FIG. 8 turn off and on, respectively. Therefore, the refresh signal RF from multiplexer 85 is applied to the frequency dividing circuit 88, and the frequency-divided refresh signal RF is applied to the refresh counter 89. Therefore, refresh counter 89 generates the row address signal RS in response to the frequency-divided refresh signal RF. Accordingly, when the ratio of frequency division by the frequency dividing circuit 88 is ⅔, the refresh period in the binary memory mode is third times the refresh period in the 4-value memory mode described above.

As described above, in the first embodiment, switching between 4-value memory and binary memory is possible. When such an SDRAM is adopted in a note book type personal computer, for example, and the SDRAM is set in the 4-value memory mode in a normal state where a number of application programs are active, the storage capacity can be enlarged to 128 megabyte, for example. By setting the SDRAM to the binary memory mode in the suspended state, the storage capacity is reduced to 64 megabyte, for example. As not much work area is necessary in the suspended state, the storage capacity of this level would be sufficient. Assuming that the refresh period in the 4-value memory mode is 64 msec, the refresh period in the binary memory mode would be 128 msec. In this manner, the refresh period is made longer in the binary memory mode. As the capacity of memory capacitor 22 is sufficiently large for a binary memory, sufficient refresh is possible. Further, as the refresh period is made longer, power consumption in the binary memory mode is reduced. Therefore, when the SDRAM is adopted in a note book type personal computer, for example, power consumption in the suspended state can be reduced.

Most of the circuits operating in the 4-value memory mode and the binary memory mode are common. Therefore, increase in layout area necessary for the circuit is suppressed. Further, sub sense amplifier 27 is inoperative in the binary memory mode, and therefore power consumption can be reduced. Further, as a logic level of mode selecting signal MLT is determined by registering a desired signal in the mode register 15 externally, the SDRAM can freely be set to the 4-value memory mode or binary memory mode.

As frequency divider 88 is provided, it is not necessary to provide two different refresh timers for the 4-value memory mode and the binary memory mode. As the auto refresh signal ARF is also divided by frequency dividing circuit 88, what is necessary is simply to apply the auto refresh command at a prescribed period no matter whether the operation is in the 4-value memory mode or the binary memory mode, and therefore control necessary for auto refreshing is simple.

Second Embodiment

Figure 18:
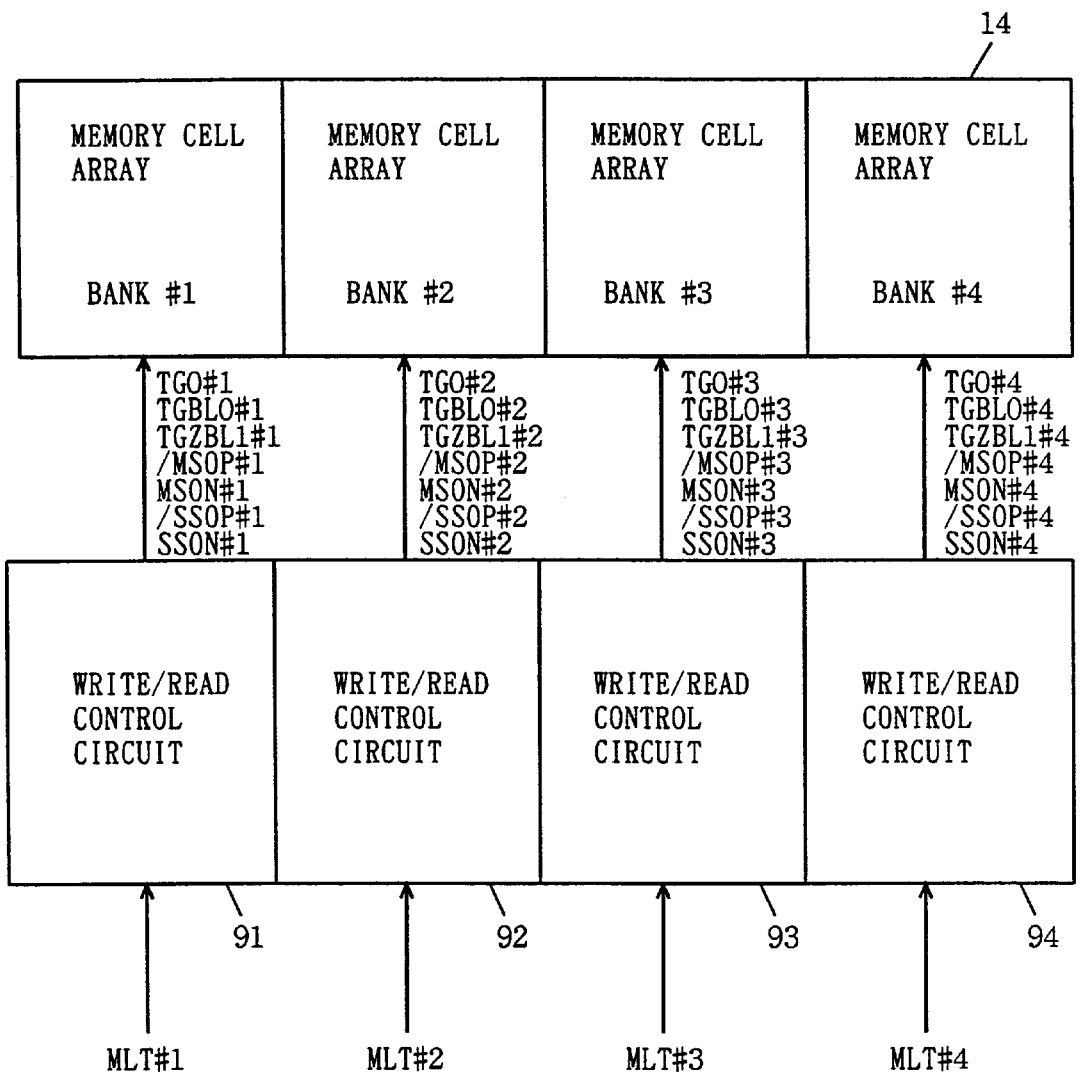
FIG. 18 is a block diagram showing a configuration of a main portion of the SDRAM in accordance with a second embodiment of the present invention.

FIG. 18 is a block diagram showing a main configuration of the semiconductor memory device in accordance with the second embodiment of the present invention. In the first embodiment described above, when write/read control circuit 40 is provided for all the banks #1 to #4, and write/read control circuit 40 controls all the banks #1 to #4 in response to one mode selecting signal MLT. In the second embodiment, four write/read control circuit 91 to 94 are provided corresponding to four banks #1 to #4, respectively, as shown in FIG. 18, and write/read control circuits 91 to 94 control banks #1 to #4 independent from each other. More specifically, write/read control circuit 91 generates control signals TG0#1, TGBL0#1, TGZBL1#1, /MS0P#1, MS0N#1, /SS0P#1 and SS0N#1 in response to a mode selecting signal MLT #1, and supplies these signals to bank #1, in the similar manner as write/read control circuit 40 shown in FIG. 4. Write/read control circuits 92 to 94 operate in the similar manner as write/read control circuit 91.

Figure 19:
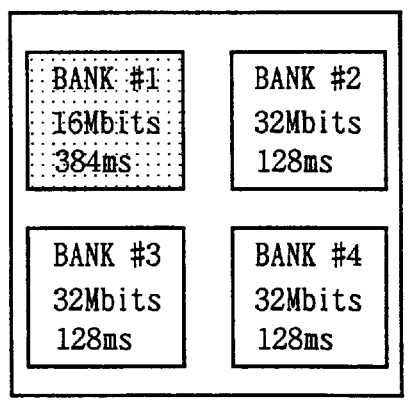
FIG. 19 shows a manner of operation of the SDRAM shown in FIG. 18.

In such an SDRAM, when mode selecting signal MLT #1 is at the L level and mode selecting signals MLT #2 to #4 are at the H level, for example, only the bank #1 enters the binary memory mode and other banks #2 to #4 enter the 4-value memory mode, as shown in FIG. 19. Therefore, storage capacity of banks #2 to #4 will be twice (32 megabits) of the storage capacity (16 megabits) of bank #1, while the refresh period of bank #1 is three times (384 msec) the refresh period (128 msec) of banks #2 to #4.

According to the second embodiment, if application programs which are active are stored in banks #2 to #4 and data in the suspended state of which access frequency is low are stored in bank #1, an SDRAM is provided which has necessary and sufficient storage capacity and low power consumption. Especially in such a semiconductor chip that has fixed storage capacity, for example, a micro processor containing SDRAM, it is possible to adjust the storage capacity and the power consumption appropriately by switching.

Third Embodiment

Figure 20:
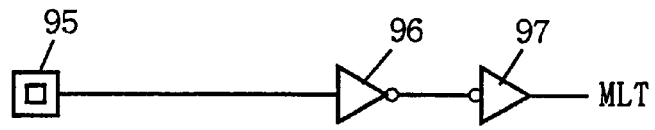
FIG. 20 is a circuit diagram showing a configuration of a mode selecting signal generating circuit in the SDRAM in accordance with a third embodiment of the present invention.

In the first embodiment described above, the mode selecting signal MLT is generated by mode register 15. In the third embodiment, the mode selecting signal MLT is generated by bonding option as shown in FIG. 20. More specifically, the SDRAM is provided with a mode selecting signal generating circuit including a pad 95 and inverter circuits 96 and 97. When a wire of the power supply voltage VCC is bonded to pad 95, mode selecting signal MLT attains to the H level. When a wire of the ground value GND is bonded to pad 95, the mode selecting signal MLT attains to the L level. Therefore, it is possible to switch the SDRAM to the 4-value memory mode or the binary memory mode by bonding option.

Therefore, it is possible to fix the SDRAM in the 4-value memory mode if the manufactured SDRAM has sufficiently large memory cell margin and to fix the SDRAM to the binary memory mode if the memory cell margin is not sufficiently large, in the assembly stage. More specifically, it is possible to fix an SDRAM which can be used as a multi-value memory in the 4-value memory mode, and to fix the SDRAM in the binary memory mode if the memory cell margin is not sufficiently large. In other, the SDRAM which can not used as the multi-value memory can be used as the binary memory. As a result, production yield can be improved.

Fourth Embodiment

Figure 21:
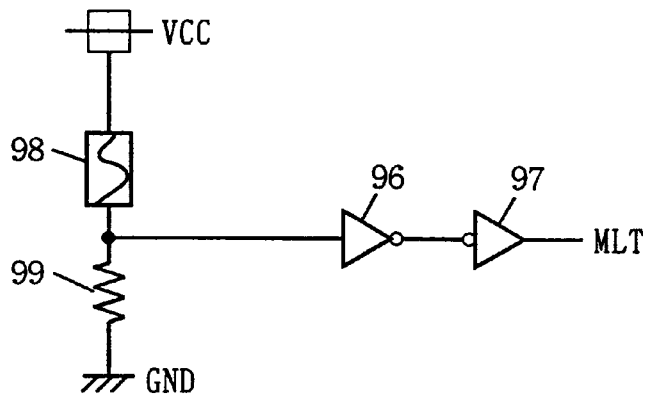
FIG. 21 is a circuit diagram showing a configuration of the mode selecting signal generating circuit in the SDRAM in accordance with a fourth embodiment of the present invention.

In the third embodiment described above, the mode selecting signal MLT is generated by bonding option. In the fourth embodiment, the mode selecting signal MLT is generated by fuse option as shown in FIG. 21. In the SDRAM, a fuse 98 and a resistance element 99 are provided in place of pad 95 shown in FIG. 20. Fuse 98 is formed of polycrystalline silicon, for example, and it can be disconnected by laser trimming, for example. Resistance element 99 has high resistance value in the order of MΩ. Therefore, when the fuse 98 is net blown off, an input of inverter circuit 96 is pulled up to the power supply voltage VCC, and mode selecting signal MLT attains to the H level. When fuse 98 is blown off, the input to inverter circuit 96 is pulled down to the ground voltage GND, and mode selecting signal MLT attains to the L level.

Therefore, it is possible to fix the SDRAM to the multi-value memory mode if the memory cell margin of the SDRAM formed on the wafer is sufficiently large, and to fix the SDRAM to the binary memory mode if the memory cell margin is not sufficient, before the stage of dicing. Therefore, as in the third embodiment, the SDRAM which can not be used as the multi-value memory can be used as the binary memory, and production yield can be improved.

Fifth Embodiment

Figure 22:
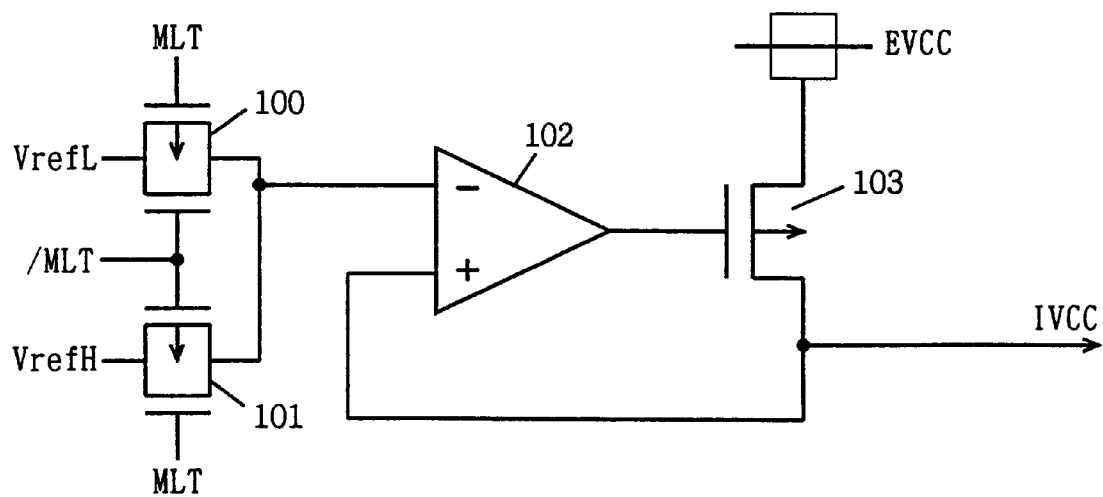
FIG. 22 is a circuit diagram showing a configuration of an internal power supply circuit in the SDRAM in accordance with a fifth embodiment of the present invention.

It is possible to additionally provided such an internal power supply circuit as shown in FIG. 22 to the SDRAM in accordance with the third embodiment. The internal power supply circuit receives external power supply voltage EVCC and supplies an internal power supply voltage IVCC lower than the external power supply voltage EVCC to memory cell array 13 shown in FIG. 1, for example.

Referring to FIG. 22, the internal power supply circuit includes transfer gates 100 and 101, a differential amplifier 102 and a P channel MOS transistor 103. Transfer gate 100 turns on/off in response to mode selecting signals MLT and /MLT, and selectively supplies a reference voltage VrefL to an inversion input terminal of differential amplifier 102. Transfer gate 101 turns on/off in response to mode selecting signals MLT and /MLT, and selectively supplies a reference value VrefH higher than the reference voltage VrefL to the inversion input terminal of differential amplifier 102. The internal power supply voltage IVCC is fed back to a non-inversion input terminal of differential amplifier 102, and differential amplifier 102 controls transistor 103 such that the internal power supply voltage IVCC is equal to the supplied reference voltage VrefL or VrefH.

In the 4-value memory mode, that is, when mode selecting signal MLT is at the H level and mode selecting signal /MLT is at the L level, transfer gate 100 turns off and transfer gate 101 turns on. Therefore, the higher reference voltage VrefH is supplied to the differential amplifier 102 and, as a result, the internal power supply circuit supplies the internal power supply voltage IVCC which is equal to the reference voltage VrefH.

In the binary memory mode, that is, when mode selecting signal MLT is at the L level and the mode selecting signal IMLT is at the H level, transfer gate 100 turns on and transfer gate 101 turns off. Therefore, the lower reference voltage VrefL is supplied to the differential amplifier 102 and, as a result, the internal power supply circuit supplies the internal power supply voltage IVCC which is equal to the reference voltage VrefL.

According to the fifth embodiment, in the 4-value memory mode, the internal power supply voltage IVCC attains higher and therefore write/read margins of the memory cell are enlarged. Further, in the binary memory mode, the internal power supply voltage IVCC decrease, therefore power consumption can be reduced while ensuring sufficient write/read margins.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of dynamic memory cells each including a memory capacitor; and
   a write/read circuit for writing a data signal in said dynamic memory cell by charging said memory capacitor to one of a first number of voltages and reading the data signal from said dynamic memory cell in a first mode, and writing a data signal in said dynamic memory cell by charging said memory capacitor to one of a second number of voltages larger than said first number and reading the data signal from said dynamic memory cell in a second mode.

2. The semiconductor memory device according to claim 1, further comprising
   a refresh circuit refreshing said dynamic memory cell in a first period in said first mode, and refreshing said dynamic memory cell in a second period shorter than said first period in said second mode.

3. The semiconductor memory device according to claim 1, wherein
   said write/read circuit includes
   a word line connected to said dynamic memory cell,
   a first bit line connected to said dynamic memory cell,
   a second bit line complementary to said first bit line,
   a first sense amplifier connected between said first bit line and said second bit line,
   a third bit line,
   a fourth bit line complementary to said third bit line,
   a second sense amplifier connected between said third bit line and said fourth bit line,
   a first transistor connected between said first bit line and said third bit line,
   a second transistor connected between said second bit line and said fourth bit line,
   a reference capacitor,
   a third transistor connected between said first bit line and said reference capacitor, and
   a fourth transistor connected between said fourth bit line and said reference capacitor.

4. The semiconductor memory device according to claim 3, wherein said write/read circuit further includes
   a control circuit turning on said first and second transistors and turning off said third and fourth transistors, thereafter activating said word line, thereafter turning off said first and second transistors, thereafter activating said first sense amplifier, thereafter turning on said third transistor, thereafter turning on said fourth transistor and thereafter activating said second sense amplifier in said second mode.

5. The semiconductor memory device according to claim 4, wherein said control circuit, after activating said second sense amplifier, inactivates said first and second sense amplifiers, thereafter turns on said first and second transistors and thereafter inactivates said word line.

6. The semiconductor device according to claim 5, wherein the following relation:

$$m=2s-1,$$

in which m=parasitic capacitance of said first bit line/capacitance of said memory capacitor, and s=parasitic capacitance of said second bit line/capacitance of said memory capacitor, is satisfied where parasitic capacitance of said first or second bit line and parasitic capacitance of said third or fourth bit line have the ratio of m:s.

7. The semiconductor memory device according to claim 3, wherein the following relation:

$$z/(2(s+z))=\tfrac{1}{3}(m+s+1),$$

in which m=parasitic capacitance of said first bit line/capacitance of said memory capacitor, s=parasitic capacitance of said second bit line/capacitance of said memory capacitor, and z=capacitance of said reference capacitor/capacitance of said memory capacitor, is satisfied, where parasitic capacitance of said first or second bit line, parasitic capacitance of said third or fourth bit line and capacitance of said reference capacitor have the ratio of m:s:z.

8. The semiconductor memory device according to claim 1, wherein said semiconductor memory device is a synchronous semiconductor memory device operating in synchronization with a clock signal, said device further comprising
   a mode register for storing a selecting signal indicating said first and second mode.

9. The semiconductor memory device according to claim 1, wherein
   said plurality of dynamic memory cells is divided into a plurality of banks operable independent from each other; and
   said write/read circuit sets any of said plurality of banks to said first mode and remaining said bank to said second mode.

10. The semiconductor memory device according to claim 1, further comprising
    a pad; and
    a selecting signal generator generating a selecting signal indicating said first and second modes in response to said pad.

11. The semiconductor memory device according to claim 1, further comprising:
    a fuse; and
    a selecting signal generator generating a selecting signal indicating said first and second modes in response to said fuse.

12. The semiconductor memory device according to claim 1, further comprising:
    an internal power supply circuit receiving an external power supply voltage for supplying a first internal power supply voltage lower than said external power supply voltage in said first mode, and supplying a second internal power supply voltage higher than said first internal power supply voltage and lower than said external power supply voltage in said second mode.

* * * * *